US006255895B1

(12) United States Patent
Kim et al.

(10) Patent No.: US 6,255,895 B1
(45) Date of Patent: Jul. 3, 2001

(54) CIRCUIT FOR GENERATING A REFERENCE VOLTAGE TRIMMED BY AN ANTI-FUSE PROGRAMMING

(75) Inventors: Young-Hee Kim, Gyungsangbook-do; Kie-Bong Ku, Gyunnggi-do, both of (KR)

(73) Assignee: Hyundai Electronics Industries Co., Ltd., Yicheon-shi (KR)

( * ) Notice: Subject to any disclaimer, the term of this patent is extended or adjusted under 35 U.S.C. 154(b) by 0 days.

(21) Appl. No.: 09/342,594

(22) Filed: Jun. 29, 1999

(30) Foreign Application Priority Data

Jun. 30, 1998 (KR) ................................. 98-26216

(51) Int. Cl.[7] ........................................ G05F 3/02
(52) U.S. Cl. .......................................... 327/530; 327/525
(58) Field of Search ................................. 327/525, 526, 327/530

(56) References Cited

U.S. PATENT DOCUMENTS

| 4,823,320 | * | 4/1989 | Smayling et al. | ................ 365/189 |
|---|---|---|---|---|
| 5,361,001 | * | 11/1994 | Stolfa | .................................... 327/525 |
| 5,525,909 | * | 6/1996 | McCollum | ........................... 327/515 |
| 5,677,888 | * | 10/1997 | Lui et al. | ............................. 365/225.7 |
| 5,838,076 | * | 11/1998 | Zarrabian et al. | .................... 327/515 |
| 5,838,624 | | 11/1998 | Pilling et al. | ...................... 365/225.7 |

* cited by examiner

Primary Examiner—Terry D. Cunningham
(74) Attorney, Agent, or Firm—Oliff & Berridge, PLC

(57) ABSTRACT

The present invention relates to a circuit for generating a reference voltage trimmed by an anti-fuse programming, comprising: reference voltage generation means for providing a reference voltage having a predetermined level; decoding means generating for decoding signals in order to trim a level of said reference voltage according the anti-fuse programming; and voltage trimming means for dividing said reference voltage using resistance variable in response to said decoding signals supplied from said decoding means, thereby trimming the level of said reference voltage. The present invention programs the anti-fuses on the basis of the voltage signals applied through the bonding pads to generate the decoding signals, and thereafter divide the reference voltage using the resistance variable in response to the decoding signals, thereby capable of minutely trimming the level of the reference voltage from the reference voltage generation means.

13 Claims, 7 Drawing Sheets

CIRCUIT FOR GENERATING A REFERENCE VOLTAGE TRIMMED BY AN ANTI-FUSE PROGRAMMING

BACKGROUND OF THE INVENTION

1. Field of the Invention

The present invention relates to a reference voltage generator for semiconductor devices, and more particularly to a circuit for generating the reference voltage whose level is capable of being minutely trimmed by the anti-fuse programming.

2. Description of the Prior Art

Recently, a reference voltage generator is used in a DRAM according to it being rapid in its precessing speed, and having a lower power consumption, and bing more highly integrated, wherein the reference voltage may be easily varied by the changes in a temperature, an external voltage, or a fabrication process.

To minimize the variation in response to the changes of the external environments, the reference voltage generator typically includes a minutely trimming circuit in order to adjust the level of the reference voltage.

FIG. 1 is a block diagram showing the conventional reference voltage generator. With reference to this drawing, the conventional reference voltage generator comprises a reference voltage generation unit 1 for generating a reference voltage Vref having a predetermined level, and a decoding unit 2 for generating signals s0 to s7 and s0b to s7b in response to the blowing of the fuses included therein so that a voltage level to be changed is selected. The decoding unit 2 further comprises a voltage trimming unit 3 for amplifying the reference voltage Vref from the reference voltage generation unit 1 on the basis of the output signals s0 to s7 and s0b to s7b in order to output the trimmed reference voltage Vro1.

Typically, the first voltage generator 1 is provided with circuits such as a Widlar reference voltage generator or a band-gap reference voltage generator.

FIG. 2 is a detailed circuit diagram showing the decoding unit 2 of FIG. 1.

As shown in this drawing, the decoding unit 2 includes fuse units F1, F2 and F3 for receiving an external voltage Vext at their one sides to respectively generate signals rep1 and repb1, rep2 and repb2, and rep3 and repb3 according to their states. The decoding unit 2 further includes an output unit DOUT1 for logically combining the signals rep1 to rep3 and repb1 to repb3 in order to apply the signals s0 to s7 and inverted signals s0b to s7b thereof to the second voltage generator 3.

The output unit DOUT1 includes NAND gates NAND1 to NAND8 for receiving three of the signals rep1 to rep3 and repb1 to repb3 to outputting the inverted signals s0b to s7b, wherein the three signals have combinations different from each other, and inverters IN1 to IN8 for being connected respectively to the output terminals of the NAND gates NAND1 to NAND8, and generating the signals s0 to s7.

FIG. 3 is a detailed circuit diagram showing the fuse unit F1 in FIG. 2.

With reference to this drawing, the fuse unit F1 in the decoding unit 2 includes a charging unit 8 for being charged by the external voltage Vext applied via a fuse PF, and an output unit Fout for buffering the voltage charged in the charging unit 8 after being enabled thereby and then supplying the output unit DOUT1 with the signals rep1 and repb1. The fuse unit F1 further comprises a discharging unit 9 for being driven by the signal from the output unit FOUT, thereby completely discharging the voltage of the charging unit 8 when the fuse PF is blown.

The charging unit 8 and the discharging unit 9 are provided with a decoupling capacitor N8 and a N-channel MOS transistor N9, respectively.

The output unit FOUT includes inverters IN9, IN10 and IN11 for being enabled thereby and sequentially coupled to the charging unit 8, the discharging unit 9 and the fuse PF in common, wherein the output terminal of the inverter IN9 is also coupled to the gate of the N-channel MOS transistor N9 included in the discharging unit 9, and the inverters IN10 and IN11 generate the signals repb1 and rep1, respectively.

The fuse units F2 and F3 included in the decoding unit 2 are the same as the above mentioned fuse unit F1 in their constructions.

Hereinafter, the operation of the conventional reference voltage generator will be described in detail referring to the attached drawings.

As shown in FIG. 1, the reference voltage generation unit 1 generates the reference voltage Vref having a predetermined level, thereafter it adjusts the inputted reference voltage Vref in the case that it is changed according to the variations in the temperature around the semiconductor device or the process thereof. Namely, the voltage trimming unit 3 amplifies the reference voltage Vref on the basis of the signals s0 to s7 and s0b to s7b from the decoding unit 2, thereby generating the trimmed reference voltage Vro1.

With reference to FIG. 2, the decoding unit 2 logically combines the signals rep1 to rep3 and repb1 to repb3 from the fuse units F1, F2 and F3 to generate the signals s0 to s7.

As shown in FIG. 3, the fuse unit F1 generates the signals rep1 and repb1. At this time, the output signal from the inverter IN9 is applied to the gate of the N-channel MOS transistor N9 included in the charging unit 9. Therefore, the N-channel MOS transistor N9 is turned on in response to the high level signal from the inverter IN9 when the fuse PF is blown, thereby causing the voltage charged in the decoupling capacitor N8 to be discharged completely. At this time, the signal rep1 is pulled up to the high level, whereas the signal repb1 is pulled down to the low level.

In this manner, if at least one of the fuses is selectively blown in accordance with an operation state of the DRAM, the decoding unit 2 supplies the second voltage generator 3 with the signals s0 to s7 and s0b to s7b, after logically combining the signals rep1 to rep3 and repb1 to repb3.

The fuses included in the fuse units F1, F2 and F3 are made of poly-silicon and can be blown by a laser beam.

In the case of cutting polysilicon using a laser beam, this laser cutting method suffers from disadvantages such that an error may occur in accurately applying the laser beam to the polysilicon and a residue may remain around the disconnection part after the cutting. Another disadvantage of the laser cutting method is in that a large amount of processing time is required and it is difficult and inaccurate to perform the method. Further, the laser cutting method has another disadvantage such that it is impossible to trim the level of the reference voltage at a packaging process of the semiconductor device, resulting in a degradation in reliability of the semiconductor device, and in a relatively high cost thereof.

SUMMARY OF THE INVENTION

Therefore, it is an object of the present invention to overcome the above problems encountered in prior arts and to provide a circuit for generating a reference voltage trimmed by an anti-fuse programming which can adjust the level of the reference voltage thereby to generate it stable against the variations in the temperature or the external voltage.

To accomplish the above mentioned object, the present invention provides a circuit for generating a reference voltage trimmed by an anti-fuse programming, comprising: reference voltage generation means for providing a reference voltage having a predetermined level; decoding means generating for decoding signals in order to trim a level of said reference voltage according the anti-fuse programming; and voltage trimming means for dividing said reference voltage using resistance variable in response to said decoding signals supplied from said decoding means, thereby trimming the level of said reference voltage

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

The application of the preferred embodiments of the present invention is best understood with reference to the accompanying drawings.

The present invention includes a reference voltage generation means for generating a reference voltage having a predetermined level, decoding means for generating decoding signals in order to trim the level of the reference voltage, and a voltage trimming means for dividing the reference voltage using resistance variable according to the decoding signals from the decoding means, thereby adjusting the level thereof.

The decoding means comprises a circuit which includes anti-fuses capable of being programmed in response to voltage signals inputted through bonding pads, and generates decoding signals according to the state of the anti-fuses. Typically, the anti-fuse is provided with a dielectric layer formed between an upper electrode and a lower electrode. The electrodes are short and thus programmed when a high voltage is applied between the electrodes.

Figure 1:
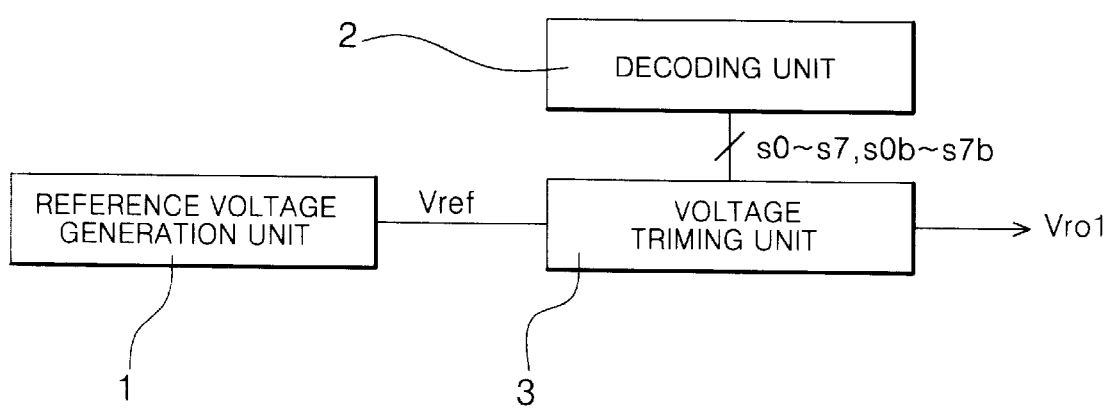
FIG. 1 is a block diagram of the conventional reference voltage generator.
Figure 2:
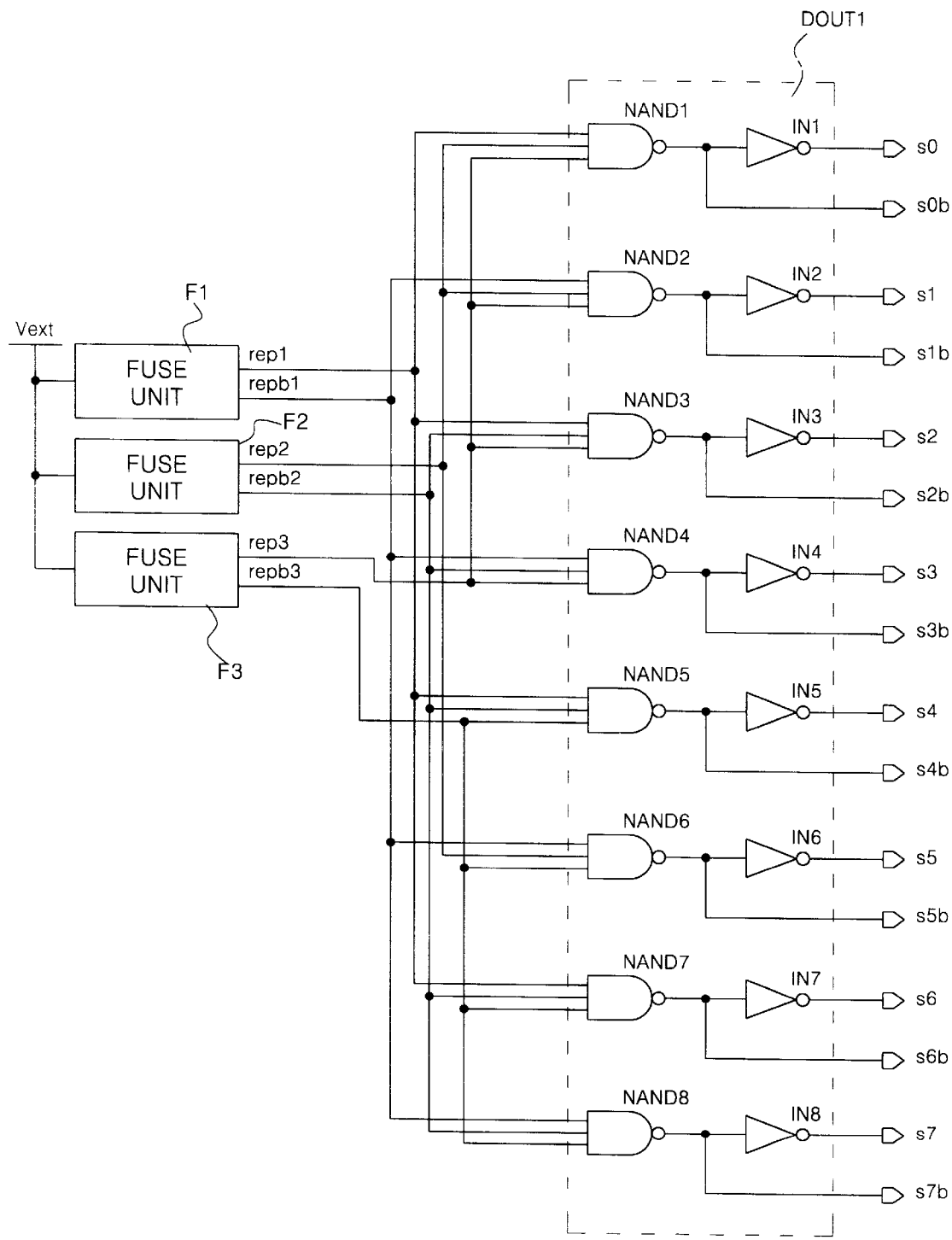
FIG. 2 is a detailed circuit diagram included in the decoding unit as shown in FIG. 1.
Figure 3:
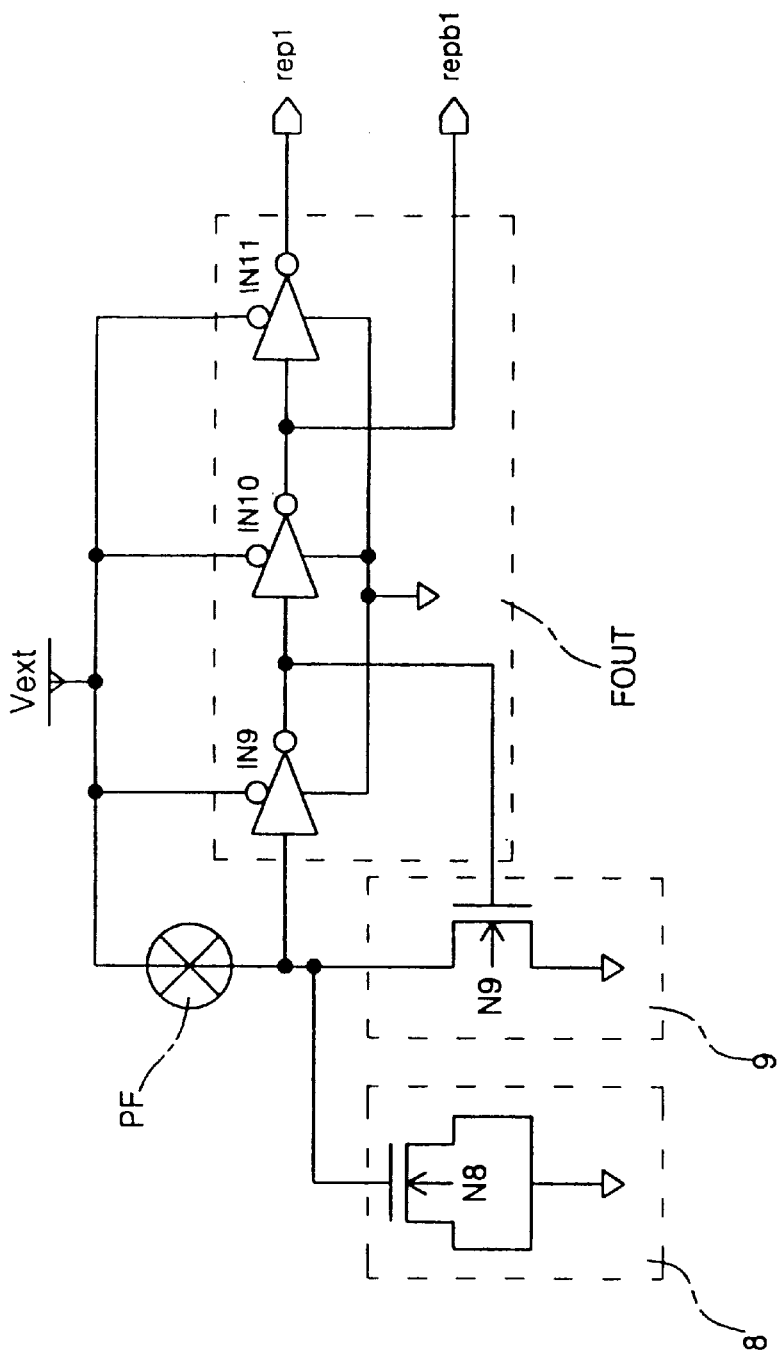
FIG. 3 is a detailed circuit diagram included in the fuse unit as shown in FIG. 2.
Figure 4:
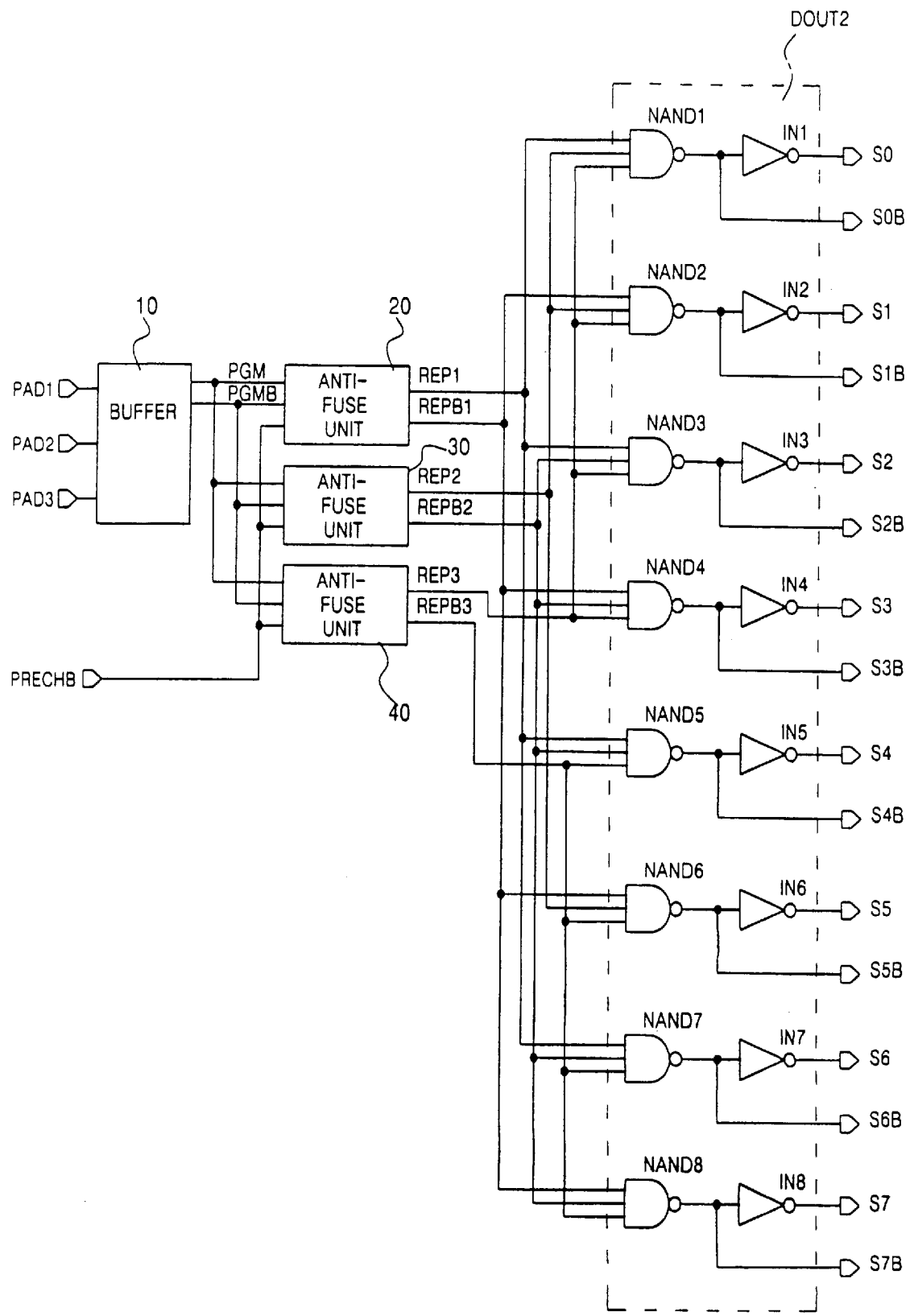
FIG. 4 is a detailed circuit diagram of a decoding means included in the circuit for generating the reference voltage trimmed by the anti-fuse.

With reference to FIG. 4, the decoding means comprises a buffer 10 for generating the signals PGM and PGMB in order to program the anti-fuses in accordance with signals inputted through bonding pads PAD1, PAD2 and PAD3, a plurality of anti-fuse units 20, 30 and 40, each of which includes the anti-fuse capable of being programmed by the signals PGM and PGMB outputted from buffer 10, and outputs a pair signals REP1 and REPB1, REP2 and REPB2, and REP2 and REPB3, respectively, in response to a state of the anti-fuse.

In the decoding means, an output unit 50 is adapted to logically combine the signals REP1 and REPB1, REP2 and REPB2, and REP2 and REPB3 from said anti-fuse units 20, 30 and 40, thereby supplying the voltage trimming means with the decoding signals S0 to S7 and S0b to S7b. The output unit 50 is the same as the output unit DOUT1 in its construction.

Also, a pre-charge signal PRECHB generated from an internal circuit of the semiconductor device is applied to the anti-fuse units 20, 30 and 40, wherein the level of the pre-charge signal PRECHB makes a low to high transition after the anti-fuse is programmed.

Figure 5:
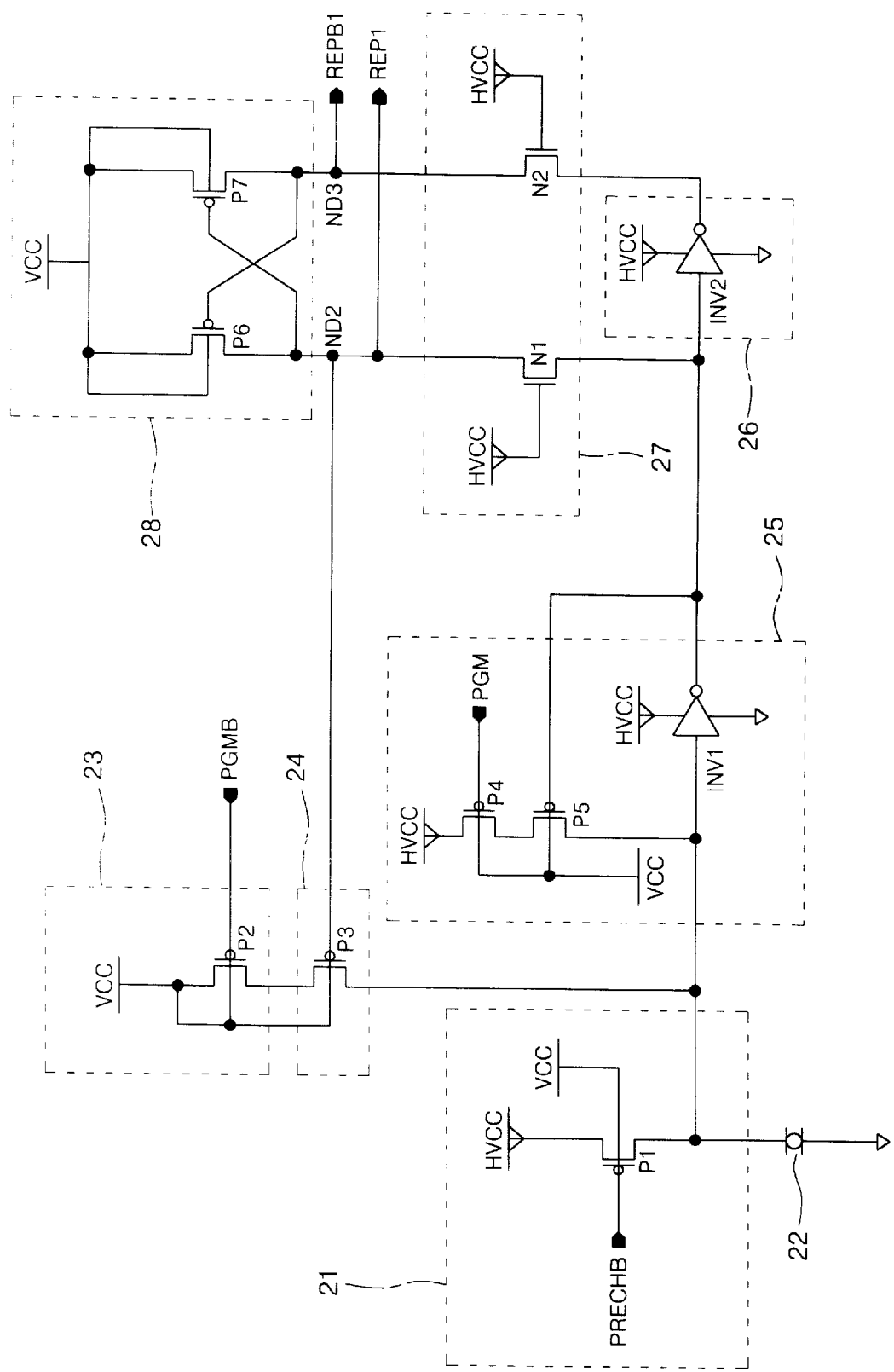
FIG. 5 is a detailed circuit diagram of an anti-fuse unit as shown in FIG. 4.

FIG. 5 is a detailed circuit diagram of the anti-fuse unit 20 as shown in FIG. 4.

With reference to this drawing, the anti-fuse unit 20 includes a pre-charge unit 21 driven by a pre-charge signal PRECHB to pre-charge the first node NDa with a half of power supply voltage HVCC, and an anti-fuse 22 at its one side coupled to said pre-charge unit 21 and to said first node NDa in common, and at its the other side grounded.

The anti-fuse unit 20 further includes a programming voltage supply unit 23 for being operated by the signal PGMB from the buffer 10 to apply a power supply voltage VCC to the anti-fuse 22 so that the anti-fuse 22, wherein the anti-fuse 22 can be programmed by the power supply voltage VCC.

The anti-fuse unit 20 further includes a current blocking unit 24 for being coupled to the programming voltage supply unit 23, and operated by voltage at the second node NDb to block a current path formed through the programming voltage supply unit 23 toward the first node NDa.

The anti-fuse unit 20 further includes a latch unit 25 coupled to the first node NDa, and inputting a signal fed back from its output terminal, thereby causing the first node NDa to be latched with the half of power supply voltage HVCC having a stable level, and an inverting unit 26 for inverting the signal from the latch unit 25.

The anti-fuse unit 20 further includes a reverse current prevention unit 27 at its one side coupled to input and output terminals of the inverting unit 26, and at its the other side coupled to the second node ND2 and the third node ND3, so that a reverse current cannot flow from the output signal lines REP1 and REPB1 respectively to the input and output terminals of said inverting unit 35.

The anti-fuse unit 20 further includes a feedback voltage supply unit 28 coupled to the reverse current prevention unit 27 via the second and third nodes NDb and NDc, and applying a feedback voltage to the current blocking unit 24, wherein the feedback voltage has the level of the power supply voltage VCC.

The lines for output signals REP1 and REPB1 are connected to the second and third nodes ND2 and ND3, respectively.

The pre-charge unit 21 is provided with a P-channel MOS transistor P1 driven by the pre-charge signal PRECHB, and supplying the first node NDa with the half of the power supply voltage HVCC.

The programming voltage supply unit 23 is provided with a P-channel MOS transistor P2 driven by the programming signal PGMB, and supplied with the power supply voltage VCC.

The current blocking unit 24 is provided with the p-channel MOS transistor P3 serially connected to the P-channel MOS transistor P2, and driven by the potential at the second node NDb.

The latch unit 25 includes a P-channel MOS transistor P4 driven by the inverted programming signal PGM, and supplied with the half of the power supply voltage HVCC, a P-channel MOS transistor P5 serially connected to the P-channel MOS transistor P4 and to the first node ND1, and driven by a feedback voltage, and an inverter INV1 for inverting the voltage signal at the first node ND1 and applying the inverted signal to the inverting unit 26.

The inverting unit 26 is provided with an inverter INV2 for being supplied with the half of the power supply voltage HVCC, and inverting an output signal of the latch unit 25 prior to applying the inverted signal to the reverse current prevention unit 27.

The reverse current prevention unit 27 includes a N-channel MOS transistor N1 connected between the second node NDb and an input terminal of the inverting unit 26, and driven by the half of the power supply voltage HVCC, and a N-channel MOS transistor N2 connected between the third node ND3 and an output terminal thereof, and driven thereby.

The feedback voltage supplying unit 28 includes a pair of P-channel MOS transistors P6 and P7 forming a cross-coupled feedback loop, thereby supplying the third and second nodes ND3 and ND2 with the power supply voltage VCC, respectively. The P-channel MOS transistors P6 and P7 have their sources supplied with the power supply voltage VCC and drains coupled to the second and third nodes NDb and Ndc, respectively. Further, the gate and drain of the p-channel MOS transistor P6 are coupled to the drain and gate of the p-channel MOS transistor P7, respectively.

On the other hand, the anti-fuse units 30 and 40 of FIG. 4 have the same construction as the above mentioned anti-fuse unit 20.

Figure 6:
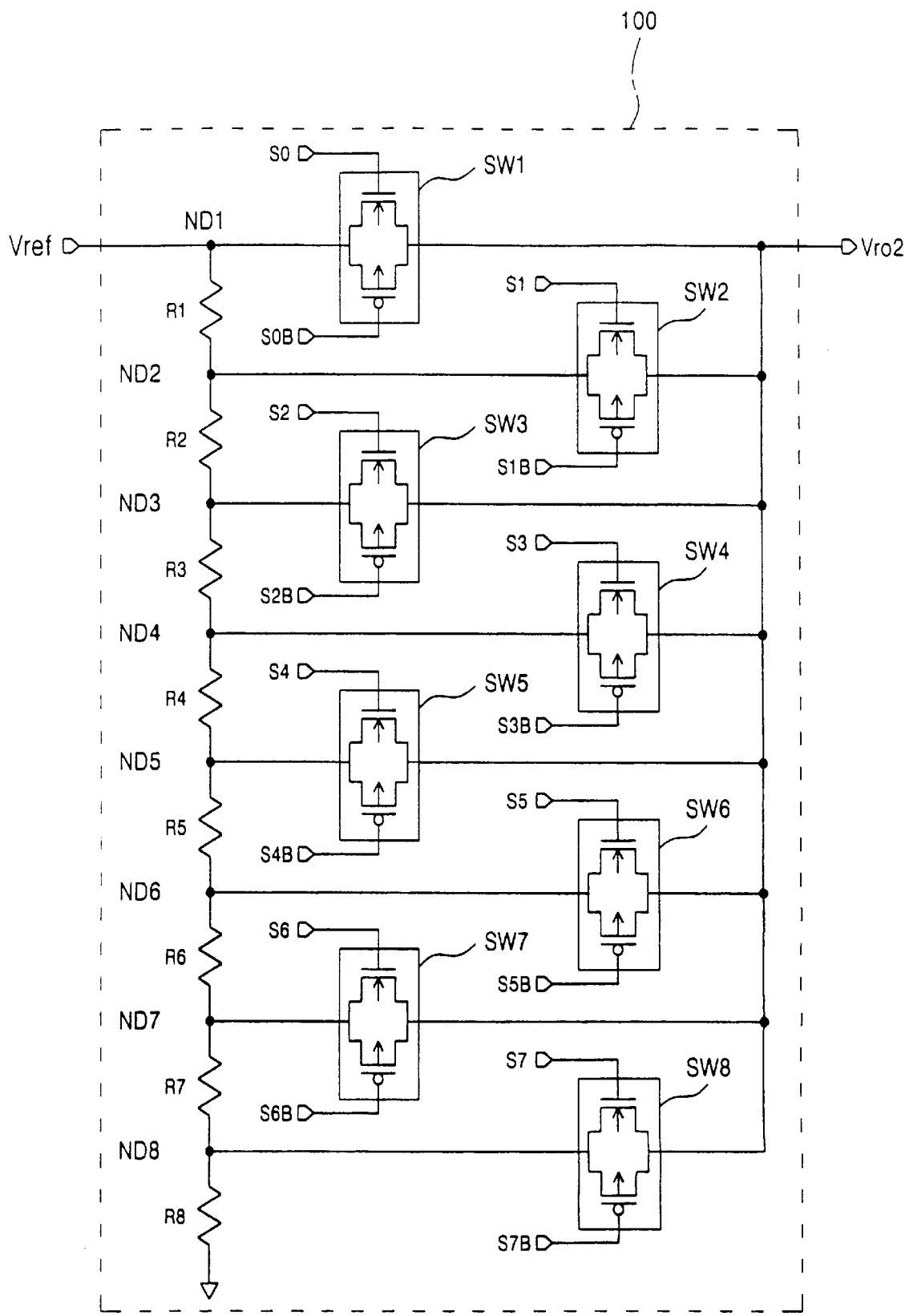
FIG. 6 is a detailed circuit diagram of a voltage trimming means included in the circuit for generating the reference voltage trimmed by the anti-fuse according the present invention.

FIG. 6 is a detailed circuit diagram of a voltage trimming means 100 included in the circuit for generating the reference voltage trimmed by the anti-fuse according the present invention.

With reference to this drawing, the voltage trimming means 100 comprises a plurality of switches SW1 to SW8 for being coupled to a corresponding one out of nodes ND1 to ND8, being turned on or off in response to the decoding signals S0 to S7 and S0B to S7B from the decoding means, and generating a trimmed reference voltage Vro2 at its output terminal. The voltage trimming means 100 further comprises a plurality of resistors R1 to R8, each of which is connected between two out of the nodes ND1 to ND8, wherein the resistor R1 is connected with the node ND1 and the resistor R8 is connected to the node ND8 at its one side and grounded at its the other side. Further, the reference voltage Vref from the reference voltage generation means is applied to an input terminal of the switch SW1 via the node ND1.

The switches SW1 to SW8 are provided with passgates, each of which comprises a pair of N-channel MOS transistor and P-channel MOS transistor.

Hereinafter, the operation of the circuit for generating a reference voltage trimmed by an anti-fuse programming according to the present invention will be described in detail referring to the attached drawings.

As shown in FIG. 4, the buffer 10 changes the signals of TTL level which are externally inputted through the bonding pads PAD1, PAD2 and PAD3 to those of CMOS level. For instance, if it is required to trim the internal voltage at the packaging process of the semiconductor device, the voltage signals of the TTL level are inputted to the bonding pads PAD1 to PAD3. The buffer 10 then outputs the programming signal PGEB and the inverted programming signal PGM on the basis of the signals inputted through the bonding pads PAD1 to PAD3.

Thereafter, as shown in FIG. 5, the anti-fuse 22 in the anti-fuse unit 20 is programmed according to the level of the programming signal PGMB as described below.

Firstly, when the anti-fuse 22 is in the normal state, the pre-charge signal PRECHB of the low level is applied to the gate of the p-channel MOS transistor P1 in the pre-charge unit 21, and the inverted programming signal PGM of the low level is inputted to the gate of the p-channel MOS transistor P4 in the latch unit 25. At this time, the programming signal PGMB of the high level is inputted to the gate of p-channel MOS transistor P2 in the programming voltage supply unit 23.

Therefore, the p-channel MOS transistor P1 is turned On to pre-charge the first node NDa with the half of the power supply voltage HVCC. The inverter INV1 in the latch unit 25 generates a signal having the low level which is fed back to the gate of the p-channel MOS transistor P5 therein. Accordingly, the p-channel MOS transistors P4 and P5 are turned On such that the half of the power supply voltage HVCC is applied to the first node NDa.

Thus, the first node NDa is pre-charged with the half of of the power supply voltage HVCC, and thereafter the pre-charge signal PRECHB makes low to high transition to turn Off the p-channel MOS transistors P1.

At this time, the n-channel MOS transistors N1 and N2 are always in a turned-on state by the half of the power supply voltage HVCC. Thus, the signal of the low level from the latch unit 25 is inverted by the inverter INV2 in the inverting unit 26, so that the signal of the high level is applied to the third node NDc via the n-channel MOS transistors N2 in the reverse current prevention unit 27, wherein the high level corresponds to the half of the power supply voltage HVCC. Since the second node NDb is connected to the output terminal of the latch unit 26 via the n-channel MOS transistors N1 therein, a signal of the low level appears at the second node NDb, and thus the inverted output signal REP1 becomes to have the low level. At this time, the p-channel MOS transistor P2 in the current blocking unit 24 is turned On. Further, the p-channel MOS transistor P7 in the feedback voltage supplying unit 28 is turned On in response to the low level at the second node NDb, so that the power supply voltage VCC is applied to the third node NDc.

As a result, in the case that the anti-fuse 22 is in the normal state, that is, the programming signal PGMB has the high level, the output signal REPB1 having the high level and the inverted output signal REP1 are outputted, wherein the output signal REPB1 has the high level of the power supply voltage VCC.

In the case that the voltage at the third node NDc has the level of the power supply voltage VCC, a reverse current may flow toward the output terminal of the inverter INV2 in the inverting unit 26 because the high voltage of the output terminal thereof has the level of the half of the power supply voltage HVCC.

To prevent the reverse current, the present invention provides the reverse current prevention unit 27.

Namely, since the n-channel MOS transistors N1 and N2 in the reverse current prevention unit 36 are driven by the half of the power supply voltage HVCC, an amount of the current capable of flowing through the transistors N1 and N2 is determined by the voltage difference between the half of the power supply voltage HVCC and the threshold voltages of the transistors N1 or N2, and thus the reverse current is to be prevented.

In this manner, the n-channel MOS transistor N1 functions for preventing the reverse current flowing from the second node ND2 toward the input terminal of the inverter INV2.

Meanwhile, in the case that the anti-fuse 22 is programmed, the p-channel MOS transistor P2 is turned On because the programming signal PGMB has the low level. At this time, the inverted signal PGM becomes to have the high level to turn off the p-channel MOS transistor P4 in the latch unit 25. In this case, the potential of the second node NDb is in the state of the low level as described hereinbefore.

Thus, the power supply voltage VCC is applied to the anti-fuse 22 via the first node NDa to short two electrodes of the anti-fuse 22. Accordingly, a current path is formed through the anti-fuse 22 toward a ground, so that the potential at the first node NDa goes the low level. Therefore, a signal of the low level appears at the first node NDa to sequentially inverted by the inverters INV1 and INV2 included in the latch unit 25 and inverting unit 26, respectively. As a result, a signal of the low level appears at the third node NDc such that the output signal REPB1 becomes to have the low level.

At this time, the signal of the high level which corresponds to the half of the power supply voltage HVCC is applied to the second node NDb, so that the inverted output signal REP1 of the high level is outputted and the p-channel MOS transistor P3 in the programming voltage supply unit 23 is turned Off. Thus, the current path formed through the anti-fuse 22 toward a ground is blocked. Also, when the signal of the low level appears at the third node NDc, the p-channel MOS transistor P6 in the feedback voltage supply unit 28 is turned, thereby causing the power supply voltage VCC to be applied to the second node NDb.

Since the half of the power supply voltage HVCC is fed back to the gate of the p-channel MOS transistor P3 and the power supply voltage VCC is also applied thereto, the current path is capable of being blocked rapidly, thereby reducing the current consumption.

The anti-fuse units 30 and 40 are operated in the same manner as the anti-fuse unit 20. Thus, the description as to the operation thereof will be omitted.

As described hereinbefore, the output signals REPB1 to REPB3 and the inverted output signals REP1 to REP3 are logically combined in the output unit 50 in the decoding means, with the anti-fuse 22 being programmed by the programming signal PGMB. As a result, the decoding signals S0 to S7 and S0B to S7B are applied to the voltage trimming means 100.

With reference to FIG. 6, the reference voltage Vref from the reference voltage generation means is applied to the switches SW1 to SW8 via the corresponding nodes ND1 to ND8, and one of the switches SW1 to SW8 is turned on according to the decoding signals S0 to S7 and S0B to S7B. In this case, the resistors R1 to R8 are connected between the nodes ND1 to ND8 and ground, and thus the reference voltage Vref is divided in accordance with the turned-on switch of the switches SW1 to SW8. As a result, the reference voltage Vref is minutely trimmed according to the decoding signals S0 to S7 and S0B to S7B from the decoding means so that the trimmed reference voltage Vro2 is generated.

Figure 7:
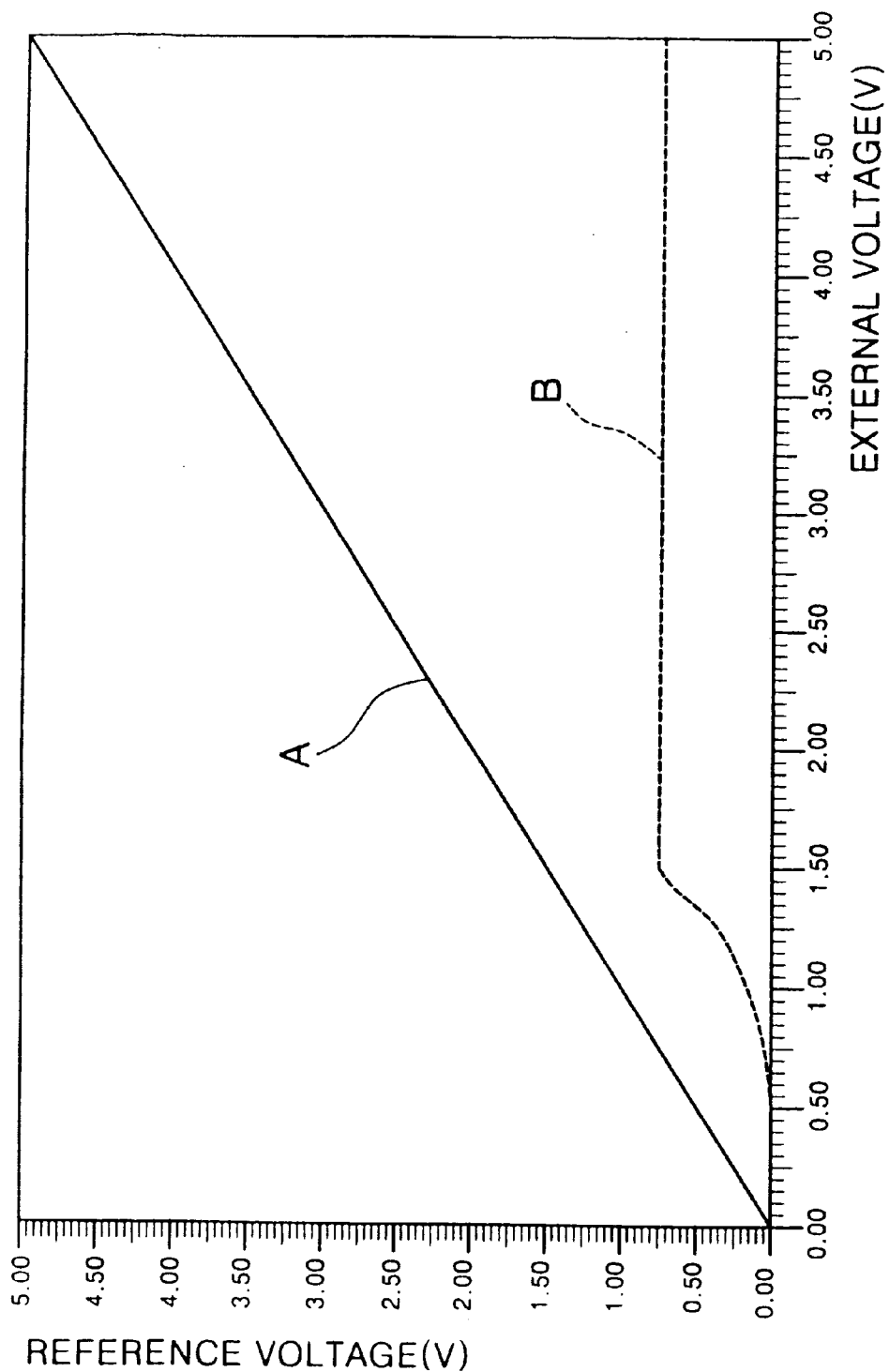
FIG. 7 is a graph illustrating a comparison between variations of the reference voltages in response to the change of the external voltage in the conventional art and present invention.

FIG. 7 is a graph illustrating a comparison between variations of the reference voltages in response to the change of the external voltage in the conventional art and present invention.

With reference to this drawing, the reference voltage A of the conventional art varies in proportion to the change of the external voltage, whereas the reference voltage B of the present invention is maintained constantly.

As apparent from the above description, the present invention programs the anti-fuses on the basis of the voltage signals applied through the bonding pads PAD1, PAD2 and PAD3 to generate the decoding signals S0 to S7 and S0B to S7B. The present invention then divide the reference voltage Vref using the resistance variable in response to the decoding signals S0 to S7 and S0B to S7B, thereby capable of minutely trimming the level of the reference voltage Vref from the reference voltage generation means.

Thus, the present invention makes it possible to apply the voltage signals from the outside to the bonding pads of the semiconductor device, and thus to conveniently trim the reference voltage even at a packaging step of fabricating the semiconductor device.

Further, since the present invention can rapidly block the current path using the cross-coupled feedback loop after the anti-fuse is programmed, it can reduce a current amount consumed when the reference voltage is adjusted.

What is claimed is:

1. A circuit for generating a reference voltage trimmed by an anti-fuse programming, comprising:
    reference voltage generation means for providing a reference voltage having a predetermined level;
    a circuit that stores the anti-fuse programming;
    decoding means generating for decoding signals in order to trim a level of said reference voltage according to the anti-fuse programming; and
    voltage trimming means for dividing said reference voltage using resistance variable in response to said decoding signals supplied from said decoding means, thereby trimming the level of said reference voltage;
    wherein said decoding means further comprises:
        buffer means for generating a programming signal and an inverted programming signal so as to program said anti-fuse in response to voltage signals inputted through bonding pads;
        a plurality of anti-fuse means each having said anti-fuse capable of being programmed by the signals from said buffer means, and outputting a pair of signals according to a state of said anti-fuse; and
        output means for logically combining the signals from said anti-fuse means;
    thereby outputting said decoding signals to said voltage trimming means.

2. A circuit for generating a reference voltage trimmed by an anti-fuse programming as set forth in claim 1, wherein said anti-fuse unit further comprises:
    pre-charge means for pre-charging a first node with a half of a power supply voltage;
    an anti-fuse at its one side coupled to said pre-charge means and to said first node in common, and at its the other side grounded;

programming voltage supply means operated by said programming signal from said buffer means to apply the power supply voltage for programming said anti-fuse;

current blocking means coupled to said programming voltage supply means and operated by voltage at a second node to block a current path formed through said programming voltage supply means toward said first node;

latch means coupled to said first node, and inputting a signal fed back from its output terminal, thereby causing said first node to be latched with the half of the power supply voltage having a stable level inverting means for inverting the signal from said latch means;

reverse current prevention means at its one side coupled to input and output terminals of said inverting means and at its the other side coupled to said second node and a third node, and preventing a reverse current cannot from flowing toward said input and output terminals thereof; and feedback voltage supply means coupled to said reverse current prevention means via said second and third nodes, and applying a feedback voltage to said current blocking means, wherein said feedback voltage has the level of the power supply voltage.

3. A circuit for generating a reference voltage trimmed by an anti-fuse programming as set forth in claim 2, wherein said pre-charge means is provided with a P-channel MOS transistor driven by said pre-charge signal to supply said first node with the half of the power supply voltage.

4. A circuit for generating a reference voltage trimmed by an anti-fuse programming as set forth in claim 2, wherein said programming voltage supply means is provided with a p-channel MOS transistor driven by said programming signal to supply the full power supply voltage.

5. A circuit for generating a reference voltage trimmed by an anti-fuse programming as set forth in claim 2, wherein said current blocking means is provided with a p-channel MOS transistor coupled to said programming voltage supply means and driven by the potential at said second node.

6. A circuit for generating a reference voltage trimmed by an anti-fuse programming as set forth in claim 2, wherein said latch means further comprises:

a first P-channel MOS transistor driven by an inverted programming signal from the programming signal generation unit, and supplied with the half of the power supply voltage;

a second P-channel MOS transistor serially connected to said first P-channel MOS transistor, and driven by a feedback voltage from an output terminal of said latch means; and an inverter for inverting a voltage signal at said first node and applying the inverted signal to said inverting-means.

7. A circuit for generating a reference voltage trimmed by an anti-fuse programming as set forth in claim 2, wherein said inverting means is provided with an inverter supplied with the half of the power supply voltage, and inverting an output signal of said latch means to apply the inverted signal to said reverse current prevention means.

8. circuit for generating a reference voltage trimmed by an anti-fuse programming as set forth in claim 2, wherein said reverse current prevention means further comprises:

a N-channel MOS transistor connected between said second node and an input terminal of said inverting means, and driven by the half of the power supply voltage;

a N-channel MOS transistor connected between said third node and an output terminal thereof, and driven thereby.

9. A circuit for generating a reference voltage trimmed by an anti-fuse programming as set forth in claim 2, wherein said feedback voltage supplying means is provided with a pair of P-channel MOS transistors forming a cross-coupled feedback loop, thereby supplying said third and second nodes with the power supply voltage.

10. A circuit for generating a reference voltage trimmed by an anti-fuse programming as set forth in claim 2, wherein said, wherein said third and second nodes are connected respectively to lines for an output signal and an inverted signal which are applied to said output means.

11. A circuit for generating a reference voltage trimmed by an anti-fuse programming as set forth in claim 2, wherein said pre-charge signal makes a low to high transition after said anti-fuse is programmed.

12. A circuit for generating a reference voltage trimmed by an anti-fuse programming as set forth in claim 1, wherein said anti-fuse means is supplied with said pre-charge signal for pre-charging a predetermined internal node with a half of a power supply voltage.

13. A circuit for generating a reference voltage trimmed by an anti-fuse programming as set forth in claim 1, wherein said the voltage trimming means further comprises:

a plurality of switches turned on or off in response to the decoding signals from said decoding means; and a plurality of resistors serially connected between ground and an input line for the reference voltage from said reference voltage generation means, wherein said resistors are connected via nodes and a first one of said resistors is connected to said input line and a last one of said resistors is grounded, and each of said switches is at its input terminal connected to a corresponding node of said nodes, and at its output terminal to an output line for a trimmed reference voltage.

* * * * *